US010193028B2

(12) United States Patent
Naka

(10) Patent No.: US 10,193,028 B2
(45) Date of Patent: Jan. 29, 2019

(54) LIGHT EMITTING DEVICE AND METHOD OF PRODUCING THE SAME

(71) Applicant: NICHIA CORPORATION, Anan-shi, Tokushima (JP)

(72) Inventor: Ryoji Naka, Tokushima (JP)

(73) Assignee: NICHIA CORPORATION, Anan-Shi (JP)

( * ) Notice: Subject to any disclaimer, the term of this patent is extended or adjusted under 35 U.S.C. 154(b) by 0 days.

(21) Appl. No.: 15/840,714

(22) Filed: Dec. 13, 2017

(65) Prior Publication Data

US 2018/0175252 A1    Jun. 21, 2018

(30) Foreign Application Priority Data

Dec. 16, 2016    (JP) .................................. 2016-244571

(51) Int. Cl.
*H01L 33/00*    (2010.01)
*H01L 21/00*    (2006.01)
*H01L 33/48*    (2010.01)
*H01L 33/62*    (2010.01)
*H01L 33/60*    (2010.01)
(Continued)

(52) U.S. Cl.
CPC ............ *H01L 33/483* (2013.01); *H01L 33/60* (2013.01); *H01L 33/62* (2013.01); *H01L 24/48* (2013.01); *H01L 25/165* (2013.01); *H01L 25/167* (2013.01); *H01L 29/866* (2013.01); *H01L 2224/48175* (2013.01); *H01L 2924/12035* (2013.01); *H01L 2924/12041* (2013.01);
(Continued)

(58) Field of Classification Search
CPC ....... H01L 33/483; H01L 33/62; H01L 33/60; H01L 25/165; H01L 25/167; H01L 29/866; H01L 24/48; H01L 2224/48715; H01L 2924/12041; H01L 2924/12035; H01L 2933/0066; H01L 2933/0058; H01L 2933/0033
USPC ..... 257/98, 99, 100, 687; 438/22, 25, 27, 29
See application file for complete search history.

(56) References Cited

U.S. PATENT DOCUMENTS

2008/0037252 A1    2/2008    Nii et al.
2008/0054287 A1    3/2008    Oshio et al.
(Continued)

FOREIGN PATENT DOCUMENTS

JP    2005-136378 A    5/2005
JP    2008-041917 A    2/2008
(Continued)

*Primary Examiner* — Thinh T Nguyen
(74) *Attorney, Agent, or Firm* — Foley & Lardner LLP

(57) ABSTRACT

A light emitting device includes: a resin package including: a plurality of leads that includes: a first lead having an upper surface, and a second lead having an upper surface, and a resin body that includes: a first resin portion, a second resin portion, a third resin portion disposed between the first lead and the second lead, and a resin connection portion, the plurality of leads and the at least one inner lateral wall surface of the first resin portion defining a recess, the second resin portion surrounding an element mounting region, and the resin connection portion connecting the first resin portion and the second resin portion at the bottom of the recess; at least one light emitting element disposed on the element mounting region; and a light-reflective member disposed between the inner lateral wall surface and the second resin portion in the recess.

5 Claims, 10 Drawing Sheets

(51) Int. Cl.
  *H01L 25/16* (2006.01)
  *H01L 29/866* (2006.01)
  *H01L 23/00* (2006.01)
(52) U.S. Cl.
  CPC .............. *H01L 2933/0033* (2013.01); *H01L 2933/0058* (2013.01); *H01L 2933/0066* (2013.01)

(56) References Cited

U.S. PATENT DOCUMENTS

| | | | |
|---|---|---|---|
| 2009/0261374 A1* | 10/2009 | Hayashi | H01L 33/62 257/99 |
| 2010/0213499 A1* | 8/2010 | Yamamoto | H01L 25/167 257/99 |
| 2013/0161665 A1 | 6/2013 | Kuwaharada et al. | |
| 2013/0170208 A1 | 7/2013 | Kuwaharada et al. | |
| 2014/0085884 A1 | 3/2014 | Horio et al. | |

FOREIGN PATENT DOCUMENTS

| | | |
|---|---|---|
| JP | 2008-060344 A | 3/2008 |
| JP | 2009-021385 A | 1/2009 |
| JP | 2009-170625 A | 7/2009 |
| JP | 2012-178598 A | 9/2012 |
| JP | 2013-115116 A | 6/2013 |
| JP | 2013-131519 A | 7/2013 |
| JP | 2014-067846 A | 4/2014 |
| JP | 2014-138088 A | 7/2014 |
| JP | 2014-158011 A | 8/2014 |
| WO | WO-2012-049853 A1 | 4/2012 |
| WO | WO-2012-049854 A1 | 4/2012 |

* cited by examiner

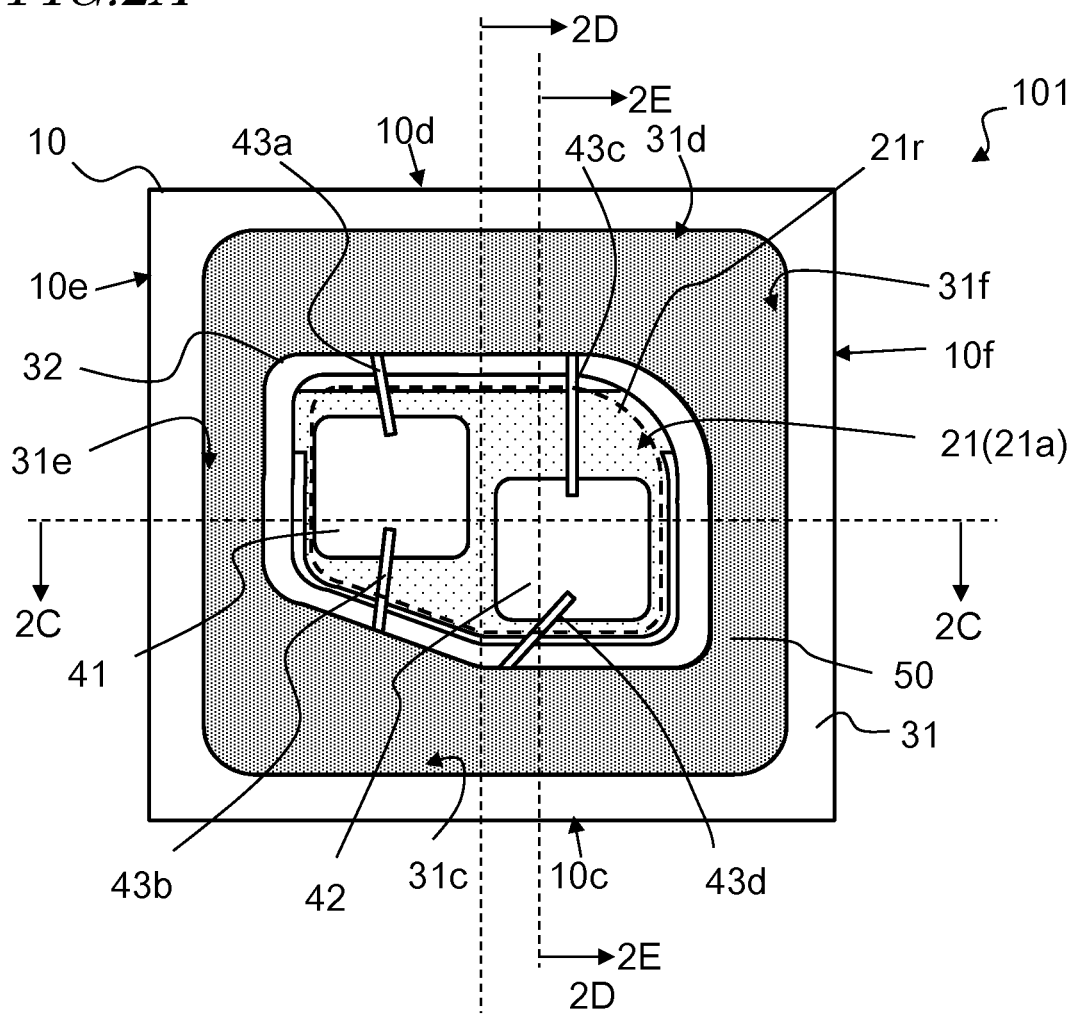

LIGHT EMITTING DEVICE AND METHOD OF PRODUCING THE SAME

CROSS-REFERENCE TO RELATED APPLICATION

This application claims priority to Japanese Patent Application No. 2016-244571, filed on Dec. 16, 2016, the disclosure of which is hereby incorporated by reference in its entirety.

BACKGROUND

The present disclosure relates to a light emitting device and a method of producing the same.

For example, a light emitting device described in Japanese Patent Publication No. 2014-158011 includes a resin package including a lead and a resin portion, a reflective layer disposed on an inner wall defining a recess of the resin package and a light emitting element disposed at a bottom of the recess.

SUMMARY OF THE INVENTION

The light emitting device disclosed in Japanese Patent Publication No. 2014-158011 includes a resin frame around the light emitting element so that the reflective layer does not cover lateral surfaces of the light emitting element. In the case where, for example, the resin portion and the resin frame to be included in the resin package of such a light emitting device are integrally formed by molding, a part of a region where the resin frame is to be disposed may not be sufficiently filled with a resin material and thus the resin frame may have a missing part. Embodiments of the present disclosure provide a highly reliable light emitting device that can inhibit the resin frame from having such a missing part, and a method of producing such a light emitting device.

A light emitting device according to one embodiment of the present disclosure includes a resin package, at least one light emitting element, and a light reflective member. The resin package includes: a plurality of leads including a first lead having an upper surface, and a second lead having an upper surface; and a resin body including a first resin portion having at least one inner lateral wall surface, a second resin portion, a third resin portion disposed between the first lead and the second lead and having an upper surface, and a resin connection portion. The plurality of leads and the at least one inner lateral wall surface of the first resin portion defines a recess. The upper surface of the first lead, the upper surface of the second lead and the upper surface of the third resin portion are located in a bottom of the recess. At the bottom of the recess, the second resin portion is in contact with a portion of the upper surface of the third resin portion and surrounds an element mounting region. The resin connection portion at the bottom of the recess connects the first resin portion and the second resin portion. The at least one light emitting element is disposed on the element mounting region at the bottom of the recess of the resin package. A light-reflective member is disposed between the inner lateral wall surface and the second resin portion in the recess.

The present disclosure can provide a highly reliable light emitting device.

BRIEF DESCRIPTION OF THE DRAWINGS

FIG. 2A is a schematic top view of the light emitting device according to an embodiment of the present disclosure.

DETAILED DESCRIPTION

Figure 1A:
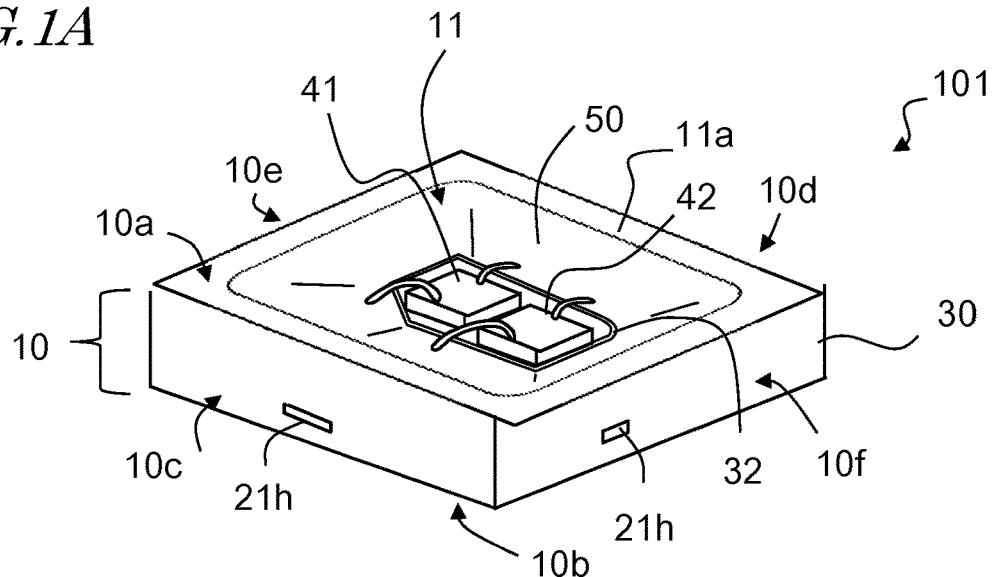
FIG. 1A is a schematic perspective view of a light emitting device according to one embodiment of the present disclosure, when viewed from above.

In a light emitting device having at least one inner wall surface that defines a recess and including a reflective layer on the inner wall surface, the reflective layer needs to be arranged so as not to cover lateral surfaces of a light emitting element in order to allow light emitted from the light emitting element to be extracted toward an outside efficiently. Examples of such a light emitting device includes a light emitting device in which a wall is disposed surrounding the light emitting element at a bottom of the recess of a resin package so that an uncured resin material that is to be the reflective layer is dammed by the wall, which allows the uncured resin material to be inhibited from contacting the light emitting element.

For manufacturing such a light emitting device, in view of cost, it is advantageous to simultaneously form the wall surrounding the light emitting element and a resin body included in the resin package. In the case of, for example, forming the resin package by molding, the wall and the resin body may be formed simultaneously by using a mold in which a space in which the resin body is to be formed is connected with a space in which the wall surrounding the light emitting element is to be formed. However, a portion of the space in which the wall surrounding the light emitting element is to be formed, for example, a portion thereof far from the resin injection opening, may not be sufficiently filled with the resin material. In this case, the resultant resin body may have a missing part. Certain embodiments described in this application have been made in view of the above problem, and one object of the present disclosure is to provide a light emitting device in which such a problem can be solved.

A light emitting device of the present disclosure will be described below in detail with reference to the drawings. The light emitting device described below is one example, and the light emitting device according to the present disclosure is not limited to the description below. In the description below, terms indicating a specific direction or position (e.g., "above", "below", or another term including such a term) will be used. Such terms will be merely used for easier understanding of the relative directions and positions in drawings referred to. The size, the positional relationship or the like of components in the drawings may be exaggerated for easier understanding and may not reflect the sizes, or the relative sizes between the components, in the light emitting device Light Emitting Device 101

Figure 1B:
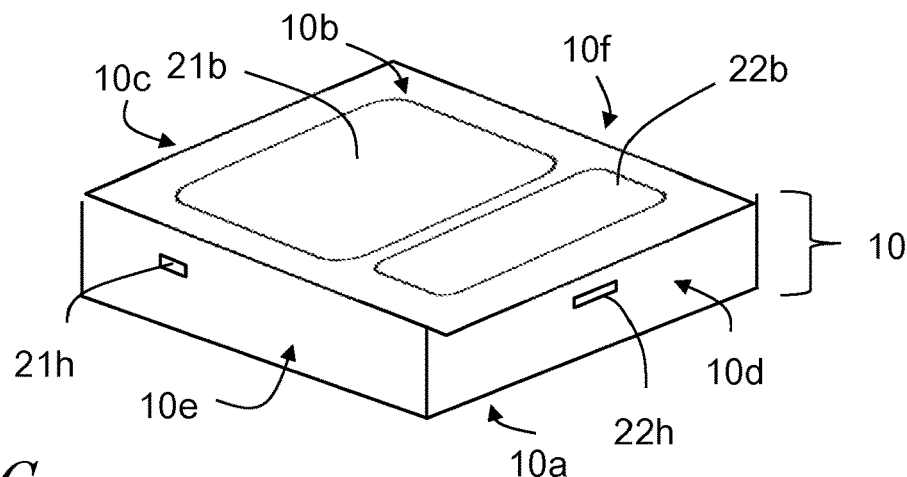
FIG. 1B is a schematic perspective view of the light emitting device according to one embodiment of the present disclosure, when viewed from below.

FIG. 1A and FIG. 1B are schematic perspective views of a light emitting device 101 when viewed from above and below the light emitting device 101, respectively.

Figure 1C:
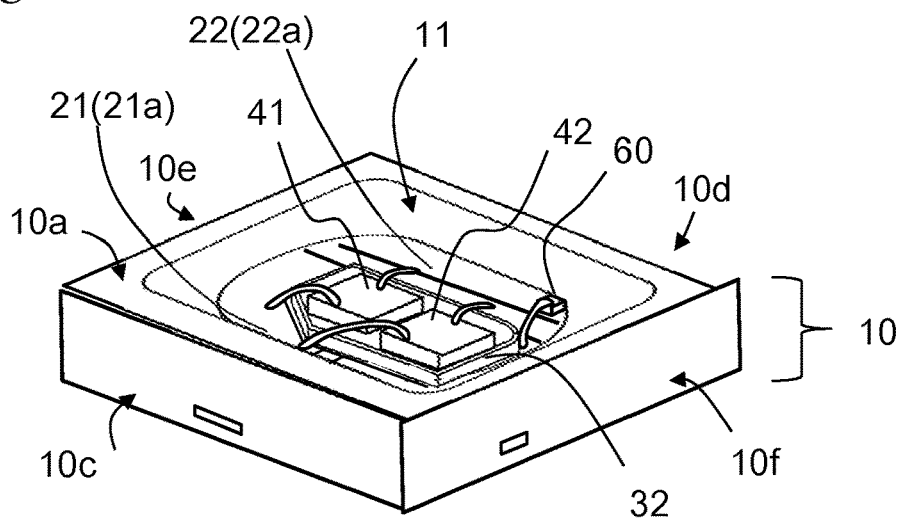
FIG. 1C is a schematic perspective view of a structure of the light emitting device according to one embodiment of the present disclosure, when viewed from above, in a state where a light-reflective member is removed.
Figure 2B:
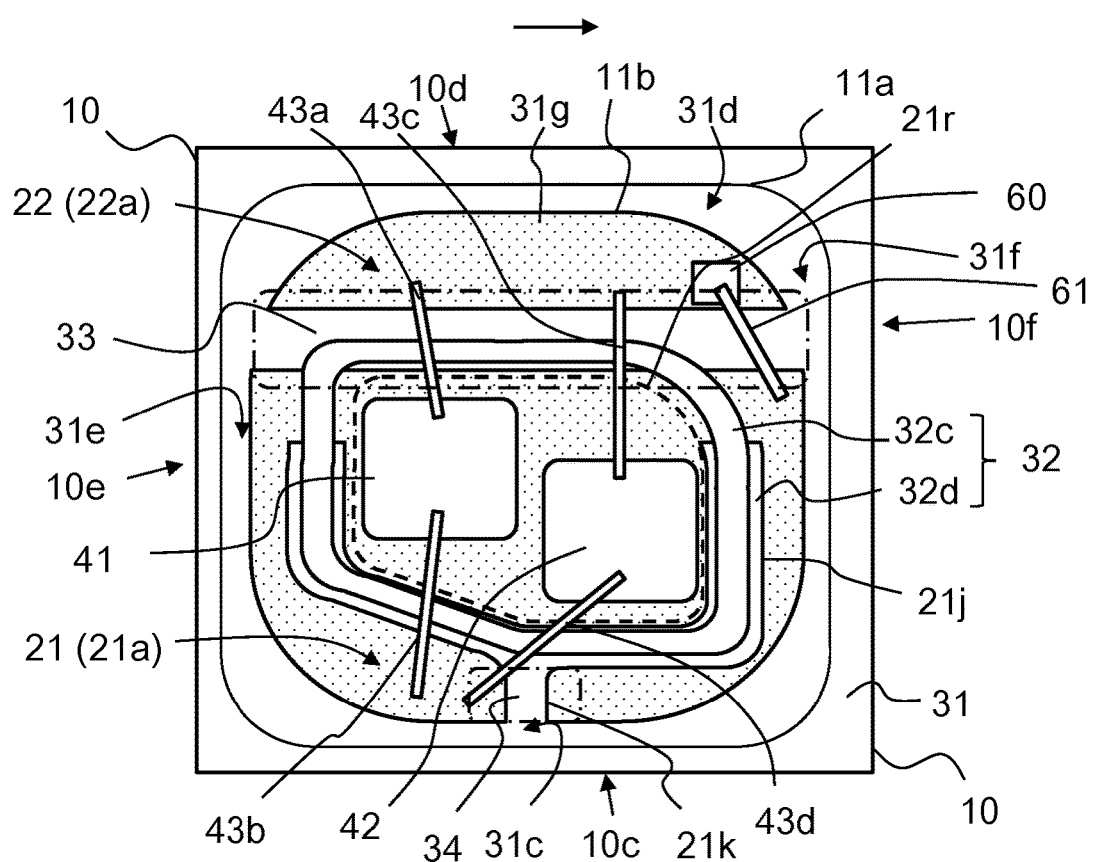
FIG. 2B is a schematic top view of a structure of the light emitting device according to one embodiment of the present disclosure, in a state where the light-reflective member is removed.
Figure 2C:
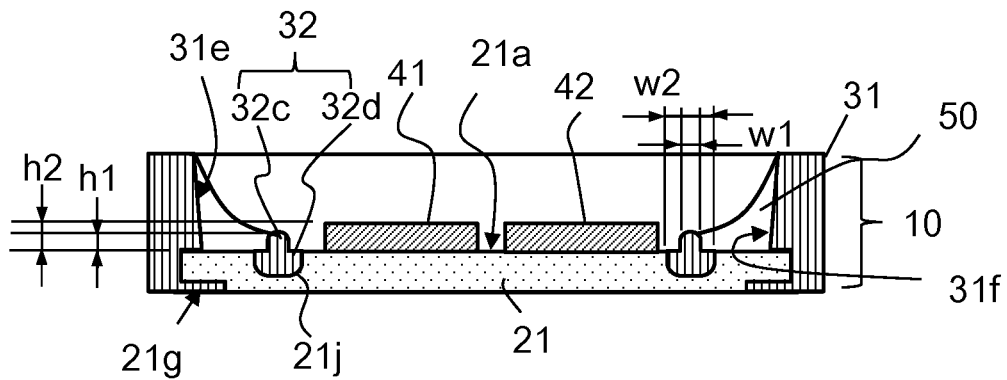
FIG. 2C is a schematic cross-sectional view of the light emitting device taken along a line 2C-2C in FIG. 2A.
Figure 2D:
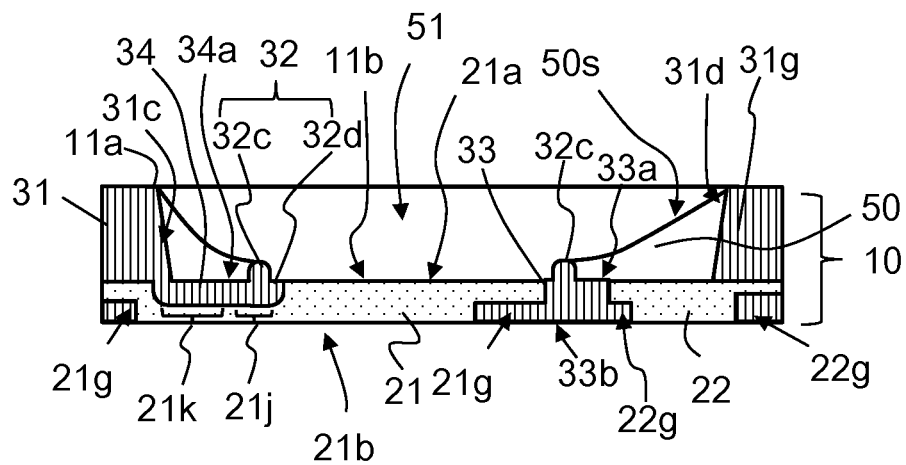
FIG. 2D is a schematic cross-sectional view of the light emitting device taken along a line 2D-2D in FIG. 2A.
Figure 2E:
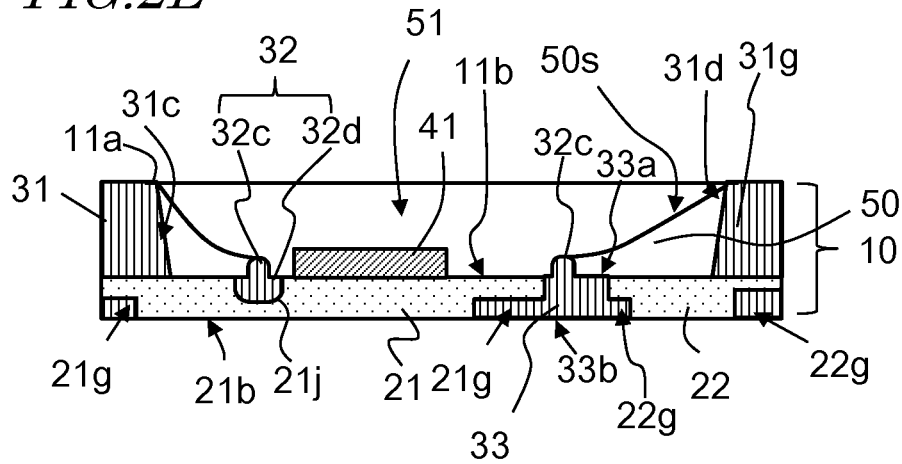
FIG. 2E is a schematic cross-sectional view of the light emitting device taken along a line 2E-2E in FIG. 2A.

FIG. 1C is a schematic perspective view of a structure of the light emitting device 101, when viewed from above the light emitting device 101, in a state where a light-reflective member 50 is removed. FIG. 2A is a schematic top view of the light emitting device 101. FIG. 2B is a schematic top view of the light emitting device 101 in a state where the light-reflective member 50 is removed. FIG. 2C, FIG. 2D and FIG. 2E are schematic cross-sectional views of the light emitting device 101 taken along a line 2C-2C, a line 2D-2D and a line 2E-2E, respectively, in FIG. 2A.

The light emitting device 101 includes a resin package 10, at least one light emitting element, and a light-reflective member 50. In the present embodiment, the light emitting device 101 includes light emitting elements 41 and 42. Each of the components of the light emitting device 101 will be described below in detail.

Resin Package 10

The resin package 10 is a housing and defines a recess 11. In the recess 11, the light emitting elements 41 and 42 and the light-reflective member 50 are disposed. The resin package 10 includes a resin body 30, a first lead 21 and a second lead 22. The resin body 30 is formed integrally with the first lead 21 and the second lead 22. The first lead 21 has an upper surface 21a and a lower surface 21b opposite to the upper surface 21a.

The second lead 22 has an upper surface 22a and a lower surface 22b opposite to the upper surface 22a. The first lead 21 and the second lead 22 are arranged such that the lower surface 21b and the lower surface 22b are in substantially the same plane. A third resin portion 33 (described below) of the resin body 30 is disposed between the first lead 21 and the second lead 22.

The resin package 10 has an upper surface 10a and a lower surface 10b opposite to the upper surface 10a. In the present embodiment, the resin package 10 has a substantially quadrangular external shape in a top view. Therefore, the resin package 10 has four outer lateral surfaces, that is, an outer lateral surface 10c, an outer lateral surface 10d opposite to the outer lateral surface 10c, an outer lateral surface 10e and an outer lateral surface 10f opposite to the outer lateral surface 10e. The shape of the resin package 10 in a top view is not limited to be a substantially quadrangular external shape, and may be any another appropriate shape. In a top view, one corner of an opening 11a of the resin package 10 may be rounded to serve as an anode mark or a cathode mark. The anode mark or the cathode mark serves as a mark indicating the polarity of the two leads 21 and 22.

The resin package 10 defines the recess 11 having the opening 11a in the upper surface 10a. At a bottom 11b of the recess 11, a portion of the upper surface 21a of the first lead 21 and a portion of the upper surface 22a of the second lead 22 are located. The shape of the recess 11 will be described in detail below in the description regarding the resin body 30.

At the bottom surface 10b of the resin package 10, a portion of the lower surface 21b of the first lead 21 and a portion of the lower surface 22b of the second lead 22 are exposed.

First Lead 21, Second Lead 22

The first lead 21 and the second lead 22 are electrically conductive, and serves as electrodes for supplying electric power to the light emitting elements 41 and 42, respectively. In the present embodiment, two leads, that is, the first lead 21 and the second lead 22, are disposed.

The light emitting device 101 may include a third lead (third metal portion) in addition to the first lead 21 and the second lead 22. The third lead (third metal portion) may serve as an electrode or as a heat dissipating member having a high heat conductivity.

Figure 3A:
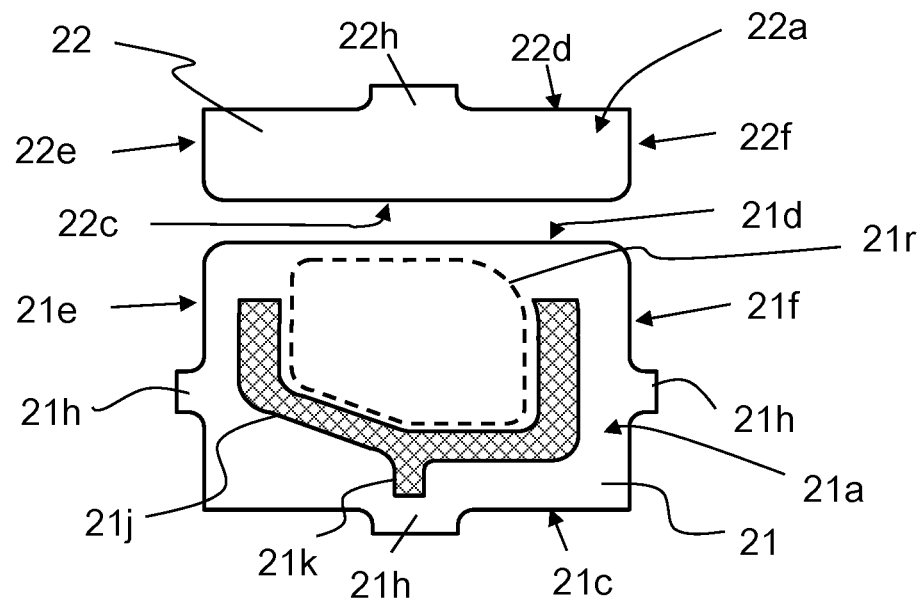
FIG. 3A is a schematic top view of a first lead and a second lead.
Figure 3B:
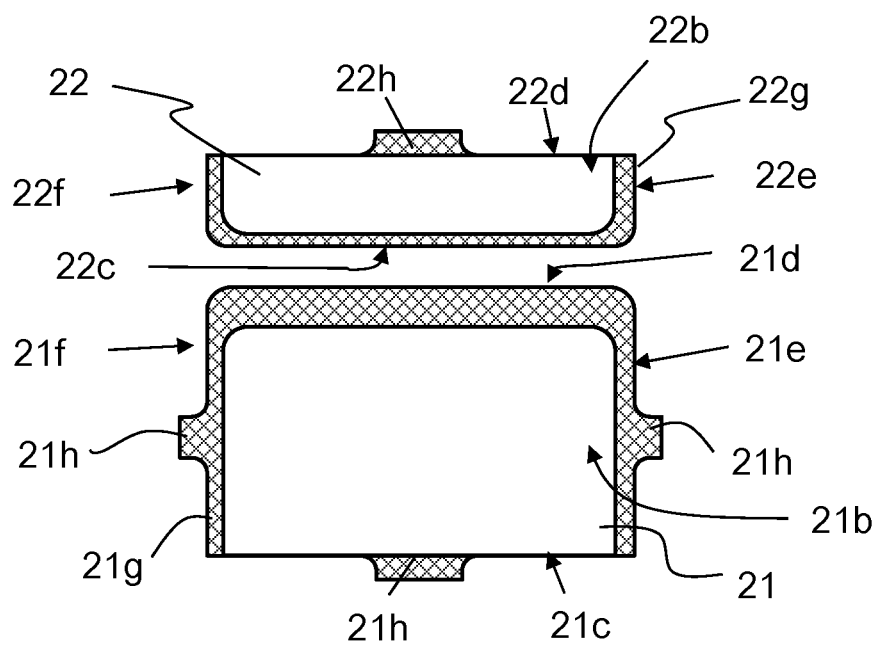
FIG. 3B is a schematic bottom view of the first lead and the second lead.

FIG. 3A is a schematic top view of the first lead 21 and the second lead 22, and FIG. 3B is a schematic bottom view of the first lead 21 and the second lead 22. The first lead 21 has lateral portions 21c, 21d, 21e and 21f. The first lead 21 has a lateral peripheral groove 21g (indicated by the hatching) in the lower surface 21b along the lateral portions 21d, 21e and 21f. The lateral peripheral groove 21g may be formed by an etching technique, a pressing technique or the like. In a top view, the first lead 21 includes extending portions 21h each disposed at the center or its vicinity of a respective one of the lateral portions 21c, 21e and 21f. Each of the extending portions 21h is a portion of the first lead 21. As shown in FIG. 1A and FIG. 1B, an end surface of each of the extending portions 21h at a respective one of the lateral portions 21c, 21e and 21f is exposed from a respective one of the outer lateral surfaces 10c, 10e and 10f of the resin package 10. The extending portions 21h extend from a main body portion of the first lead 21 toward the outer lateral surfaces 10c, 10e and 10f of the resin package 10. Referring to FIG. 3A and FIG. 3B, the "main body portion" refers to a portion of the first lead 21 excluding the extending portions 21h and having a substantially quadrangular external shape in a top view.

It is preferable that the upper surface 21a of the first lead 21 has a first groove 21j and a second groove 21k formed therein. The first groove 21j is disposed along at least a portion of an outer perimeter of an element mounting region 21r (indicated by the dashed line in FIG. 3A) of the upper surface 21a. The element mounting region 21r refers to a region of the first lead 21 on which the light emitting elements 41 and 42 are to be mounted. The expression that "the first groove 21j is disposed along at least a portion of the outer perimeter of the element mounting region 21r" encompasses a case where the first groove 21j is disposed along an entirety of the outer perimeter of the element mounting region 21r, and a case where the first groove 21j is disposed along a portion of the outer perimeter of the element mounting region 21r. The first groove 21j is filled with a portion of a second resin portion 32 (described below) of the resin body 30.

It is preferable that the first groove 21j is disposed not to overlap the lateral peripheral groove 21g disposed along the lateral portion 21d in a top view. If the first groove 21j disposed in the upper surface 21a and the lateral peripheral groove 21g disposed in the lower surface 21b overlap each other, a thickness of a corresponding portion of the first lead 21 is reduced from the upper surface 21a and the lower surface 21b, and thus may not have a sufficiently high strength. In view of this, with the first groove 21j formed in the upper surface 21a is disposed not to overlap the lateral peripheral groove 21g disposed along the lateral portion 21d in a top view, the first lead 21 can have a sufficiently high strength.

One of two end portion of the second groove 21k is connected with the first groove 21j. In the light emitting device 101 shown in FIG. 2B, the second groove 21k is connected with a center or in the vicinity of the center of the first groove 21j in the longitudinal direction thereof. In the case where, as in the light emitting device 101 shown in FIG. 2B, the first groove 21j has a bent portion, it is preferable that the second groove 21k is connected with the bent portion. With the second groove 21k disposed in the vicinity of the bent portion, the bent portion can be inhibited from insufficiently filled with the resin material, or the obtained resin body can be inhibited from having a missing part at the bent portion. The other end of the second groove 21k is connected with a first resin portion 31. As described below, a resin connection portion 34 of the resin body 30 is disposed in the second groove 21k.

Similarly, the second lead 22 has lateral portions 22c, 22d, 22e and 22f. The second lead 22 has a lateral peripheral groove 22g (indicated by the hatching) in the lower surface 22b along the lateral portions 22c, 22e and 22f. In a top view, the second lead 22 includes an extending portion 22h at the center or its vicinity of the lateral portion 22d. The extending portion 22h is a portion of the second lead 22. An end surface of the extending portion 22h at the lateral portion 22d is exposed from the outer lateral surface 10d of the resin package 10. The extending portion 22h extends from a main body part of the second lead 22 toward the outer lateral surface 10d of the resin package 10. Referring to FIG. 3A and FIG. 3B, the "main body part" refers to a portion of the second lead 22 excluding the extending portion 22h and having a substantially quadrangular external shape in a top view.

In the resin package 10, the first lead 21 and the second lead 22 are disposed apart from each other at a predetermined distance. The lateral portion 21d of the first lead 21 faces the lateral portion 22c of the second lead 22.

In this embodiment, the first lead 21 has an area size larger than that of the second lead 22 in a top view. This is because the first lead 21 includes the element mounting region 21r. In the case where the second lead 22 has the element mounting region 21r, the area size of the second lead 22 may be larger than the area size of the first lead 21 in a top view. Alternatively, the element mounting region 21r may be disposed over the first lead 21 and the second lead 22. In this case, the first lead 21 and the second lead 22 may have substantially the same area size in a top view.

The lateral peripheral grooves 21g and 22g are formed in the first lead 21 and the second lead 22 to improve the adhesiveness between the resin body 30 and the first lead 21 and between the resin body 30 and the second lead 22.

A lead frame (described below) includes portions to be the first lead 21 and the second lead 22 (in the description below, such portions will be referred to simply as the first lead 21 and the second lead 22). Each of the extending portions 21h and 22h is a portion of a respective one of connecting portions 23 and 24, each of which connects a main body portion of a respective one of the first leads 21 and a main body portion of a respective one of the second leads 22 to a frame portion of the lead frame. The lead frame includes the frame portion, the plurality of connecting portions 23 and 24, the main body portions of a plurality of the first leads 21, and the main body portions of a plurality of the second leads 22. Each of the plurality of connecting portions 23 connects the main body portions of adjacent ones of the first leads 21, and each of the plurality of connecting portions 24 connecting the main body portion of a respective one of the first leads 21 and the main body portion of a respective one of the second leads 22. The resin body 30 is formed integrally with the lead frame, and then is cut at the coupling portions to be singulated. Therefore, the extending portions 21h and 22h, each of which was a portion of a respective one of the coupling portions, are respectively exposed from corresponding ones of the outer lateral surfaces 10c, 10d, 10e and 10f of the resin package 10 to be in substantially the same plane as the resin body 30. After the lead frame is singulated, the first lead 21 including the main body part and the extending portions 21h is obtained, and the second lead 22 including the main body part and the extending portion 22h is obtained.

Each of the first lead 21 and the second lead 22 includes a substrate and a metal layer covering the substrate. The substrate is preferably a plate-like member. The substrate contains a metal material such as copper, aluminum, gold, silver, iron, nickel, an alloy of two or more of these, a phosphor bronze, iron-containing copper, or the like. The substrate maybe of a single layer or have a multilayer structure (for example, including a clad material). In particular, for the substrate, copper, which is less expensive and has a high heat-dissipating property, can be preferably used. The metal layer contains, for example, silver, aluminum, nickel, palladium, rhodium, gold, copper, an alloy of two or more of these, or the like. Each of the first lead 21 and the second head 22 may include a region with no metal layer. In the first lead 21 and the second lead 22, the upper surfaces 21a and 22a and the lower surfaces 21b and 22b may be made of different metal materials. For example, the metal layer with a multilayer structure containing a nickel layer may be disposed at the upper surfaces 21a and 22a side, and the metal layer with a multilayer structure not containing a nickel layer may be disposed at the lower surfaces 21b and 22b side.

In the case where, for the metal layer, a silver-plated or silver alloy-plated layer is disposed at an outermost surface side of each of the first lead 21 and the second lead 22, it is preferable to dispose a protective layer of silicon oxide or the like on the silver-plated or silver alloy-plated layer. With this arrangement, the silver-plated or silver alloy-plated layer can be inhibited from being discolored by a sulfur component or the like in the air. The protective layer may be formed by using a vacuum process such as, for example, sputtering or the like, but may be formed by any other appropriate known method. The protective layer may be formed after the light emitting elements 41 and 42 are mounted and connected via a wire and before the light-reflective member 50 is formed, or may be partially formed after the light-reflective member 50 is formed.

Resin Body 30

Returning to FIG. 2B, the resin body 30 will be described. The resin body 30 is formed integrally with the first lead 21 and the second lead 22, and is included in the resin package 10 together with the first lead 21 and the second lead 22. The resin body 30 includes the first resin portion 31, the second resin portion 32, the third resin portion 33, and the resin connection portion 34.

The first resin portion 31 has four inner lateral surfaces, that is, inner lateral wall surface surfaces 31c, 31d, 31e and 31f. The first resin portion, which define the recess 11 together with the first lead 21 and the second lead 22. The inner lateral wall surface 31c and the inner lateral wall surface 31d face each other, and the inner lateral wall surface 31e and the inner lateral wall surface 31f face each other.

The first resin portion 31 also has the outer lateral surfaces 10c, 10d, 10e and 10f of the resin package 10. The outer lateral surfaces 10c, 10d, 10e and 10f are opposite to the inner lateral wall surfaces 31c, 31d, 31e and 31f, respectively.

As shown in FIG. 2B, of the inner lateral wall surfaces 31c, 31d, 31e and 31f, two adjacent inner lateral wall surfaces are connected with each other to form a curved surface, and there is no clear border between such two adjacent inner lateral wall surfaces. The opening 11a of the recess 11 has an approximately quadrangular shape in which the four corners are rounded. A bottom 11b of the recess 11 has an outer perimeter with four corners that are rounded to form an arc shape having a larger radium than that of the four corners of the outer perimeter of the opening 11a.

The second resin portion 32 is located at the bottom 11b of the recess 11, and is disposed surrounding the element mounting region 21r. The second resin portion 32 demarcates an inner periphery of the light-reflective member 50, and inhibits the light-reflective member 50 from directly covering lateral surfaces of each of the light emitting elements 41 and 42. With the light-reflective member 50 that does not directly cover the lateral surfaces of each the light emitting elements 41 and 42, light emitted to a lateral side of each of the light emitting elements 41 and 42 is inhibited from being confined at an inner side of the light-reflective member 50. As shown in FIG. 2C, the second resin portion 32 includes a second portion 32d disposed in the first groove 21j, which is formed in the upper surface 21a, at a position below a plane including the upper surface 21a, and a first portion 32c disposed on the second portion 32d at a position above the plane including the upper surface 21a. In the present embodiment, the first portion 32c of the second resin portion 32 has a height h1 from the upper surface 21a of the first lead 21 and width w1, and has a ring shape to continuously surround the element mounting region 21r.

As shown in FIG. 2B, a part of the first portion 32c is on the upper surface 21a, another part of the first portion 32c is on the second portion 32d in the first groove 21j, and the remaining part of the first portion 32c is on an upper surface 33a of the third resin portion 33 described below. It is preferable that width w2 of the first groove 21j is greater than width w1 of the first portion 32c. Increase in width w2 of the first groove 21j allows the contact area size between the second resin portion 32 and the first lead 21 to be increased, and reduction in width w1 of the first portion 32c allows for sufficiently securing a path for flowing the light-reflective member 50 at the time of disposing the light-reflective member 50 (described below). Namely, the second resin portion 32 on the upper surface 21a can be inhibited from being detached from the first lead 21, and the light-reflective member 50 can be disposed efficiently. Further, reduction in width w1 of the first portion 32c allows for facilitating a light-reflective surface (inclined surface 50s) of the light-reflective member 50 to be inclined. As a result, light emitted from the light emitting elements 41 and 42 is extracted upward efficiently.

It is preferable that height h1 of the first portion 32c from the upper surface 21c is smaller than height h2 of each of the light emitting elements 41 and 42 from the upper surface 21c. This allows light emitted from the light emitting elements 41 and 42 to be easily incident on the inclined surface 50s of the light-reflective member 50, and thus allows light to be emitted outside from the opening 11a efficiently.

The resin connection portion 34 is a portion of the resin body 30 that is between the second resin portion 32 and the first resin portion 31, and connects the second resin portion 32 and the first resin portion 31 to each other. In this embodiment, the connection portion 34 is located in the second groove 21k in the first lead 21, and is connected with the second resin portion 32 and with the first resin portion 31 at a border region between the inner lateral wall surface 31c of the first resin portion 31 and the bottom 11b of the recess. More specifically, one of two end portions of the resin connection portion 34 is connected with the second portion 32d of the second resin portion 32. The other end portion of the resin connection portion 34 is in contact with the inner lateral wall surface 31c of the first resin portion 31, and is connected with a part of the first resin portion 31 that extends toward the lower surface 21b of the first lead 21 from the bottom end portion of the inner lateral wall surface 31c. As shown in FIG. 2D, in this embodiment, the resin connection portion 34 does not protrude upward from the upper surface 21a of the first lead 21, and an upper surface 34a of the resin connection portion 34 and the upper surface 21a of the first lead 21 are located at substantially the same height. With this arrangement, when an uncured resin material for the light-reflective member 50 is injected toward the bottom 11b of the recess 11, the uncured resin material flows on the bottom 11b by natural flowing without being obstructed by the resin connection portion 34. Alternatively, the resin connection portion 34 may protrude upward from the upper surface 21a of the first lead 21. In the case where, for example, the upper surface 21 of the first lead 21 does not have the second groove 21k formed therein, the resin connection portion 34 protrudes upward from the upper surface 21a of the first lead 21. In the case where the resin connection portion 34 protrudes upward from the upper surface 21a of the first lead 21, it is preferable that the connection portion 34 has a height smaller than that of the second resin portion 32. Such an arrangement allows the uncured resin material for the light-reflective member 50 to be spread on the bottom 11b without being completely stopped.

The third resin portion 33 is a portion of the resin body 30 between the first lead 21 and the second lead 22. The third resin portion 33 has the upper surface 33a and a lower surface 33b. The upper surface 33a is at the bottom 11b of the recess 11. The upper surface 33a is at the same height as that of the upper surface 21a of the first lead 21 and the upper surface 22a of the second lead 22. The upper surface 33a does not protrude upward from the upper surface 21a of the first lead 21 or the upper surface 22a of the second lead 22. The lower surface 33b is at the lower surface 10b of the resin package 10. he third resin portion 33 is connected with a wall portion of the first resin portion 31 having the inner lateral wall surface 31e and a wall portion of the first resin portion 31 having the inner lateral wall surface 31f. In the case where, for example, the light emitting device 101 includes a third lead (i.e., third metal portion), the third resin portion 33 is located between the first lead 21 and the third lead (i.e., third metal portion) and between the second lead 22 and the third lead (i.e., third metal portion).

On the upper surface 33a of the third resin portion 33, a part of the first portion 32c of the second resin portion 32 is located as described above. With such a positional relationship between the second resin portion 32 and the third resin portion 33, when an uncured resin material to be formed into the resin body 30 by a molding method flows into a die, the resin material is introduced to a space in which the third resin portion 33 is to be formed and then to a space in which the second resin portion 32 is to be formed.

For a resin material to serve as a base material of the resin body 30, a thermosetting resin, a thermoplastic resin or the like may be used. Specific examples of the such a resin material include: curable materials, such as an epoxy resin composition, a silicone resin composition, a modified epoxy resin composition such as a silicon-modified epoxy resin, a modified silicone resin composition such as an epoxy-modified silicone resin, an unsaturated polyester resin, a saturated polyester resin, a polyimide resin composition, a modified polyimide resin composition, and the like; polyphthalamide (PPA); a polycarbonate resin; polyphenylenesulfide (PPS); a liquid crystal polymer (LCP); an ABS resin; a phenol resin; an acrylic resin; and a PBT resin. In particular, a thermosetting resin such as an epoxy resin composition or a modified silicone resin composition can be preferably used. As described above, the first resin portion 31, the second resin portion 32, the third resin portion 33 and the resin connection portion 34 are integrally connected with each other, and therefore may be made of the same resin material. The resin body 30 has a viscosity of, preferably, in a range of 10 pa·s to 40 pa·s, and more preferably, 15 pa·s to 25 pa·s, in an uncured state. With such a viscosity, during manufacturing, the first resin portion 31, the second resin portion 32, the third resin portion 33 and the resin connection portion 34 may be formed with a high fluidity even by a molding method using a mold.

For the resin body 30, a material having a low light reflectance with respect to external light for the light emitting device 101 (typically, sunlight) may be used in order to improve the contrast of the light emitting device 101. In this case, it is generally preferable that the resin body 30 is black or of a color close thereto. Examples of the filler used for such a resin body 30 include: carbon such as acetylene black, active carbon, or graphite; a transfer metal oxide such as iron oxide, manganese dioxide, cobalt oxide, or molybdenum oxide; and a colored organic pigment. Such fillers may be used in accordance of a purpose.

At the bottom 11b of the recess portion 11, the second portion 32b of the second resin portion 32 is connected with the first resin portion 31 via the resin connection portion 34. A part of the first portion 32c of the second resin portion 32 is located in the upper surface 33a of the third resin portion 33 and is connected with the third resin portion 33. This arrangement allows for inhibiting the second resin portion 32 from being detached and separated from the resin package 10. The second portion 32d of the second resin portion 32 and the resin connection portion 34 are formed in the first groove 21j and the second groove 21k, respectively, in the first lead 21.

Therefore, the contact area between the second portion 32d of the second resin portion 32 and the first lead 21 and the contact area between the resin connection portion 34 and the first lead 21 are increased, which allows for improving the adhesiveness, as compared with the case where the second portion 32d of the second resin portion 32 and the resin connection portion 34 are disposed on the upper surface 21a of the first lead 21. This allows the second resin portion 32 to be securely disposed at the bottom 11b.

Light Emitting Elements 41 and 42

For each of the light emitting element 41 and 42, a semiconductor light emitting element such as a light emitting diode can be used. In the present embodiment, the light emitting device 101 includes two light emitting elements. Alternatively, the light emitting device 101 may include one light emitting element, or three or more light emitting elements. Each of the light emitting elements 41 and 42 preferably contains a nitride semiconductor that can emit light in an ultraviolet range to a visible range ($In_xAl_yGa_{1-x-y}N$, $0 \leq x$, $0 \leq y$, $x+y \leq 1$). For example, the light emitting elements 41 and 42 may be configured to emit blue light and green light, respectively. In the case where the light emitting device 101 includes three light emitting elements, the three light emitting elements may be configured to emit blue light, green light and red light, respectively.

The light emitting elements 41 and 42 are disposed on the element mounting region 21r of the first lead 21, and are joined with the first lead 21 by a joining member. The material of the joining member may be, for example, a resin containing a resin material for the resin body 30 as described above; a solder such as a tin-bismuth based solder, a tin-copper based solder, a tin-silver based solder, a gold-tin based solder; a conductive paste or bump of silver, gold, palladium or the like; or a brazing material such as an anisotropic conductive material or a low melting point metal material. In the present embodiment, each of the light emitting elements 41 and 42 is electrically connected with the first lead 21 and the second lead 22 by respective ones of wires 43a, 43b, 43c and 43d. In the present embodiment, the light emitting elements 41 and 42 are connected in parallel between the first lead 21 and the second lead 22. Alternatively, the light emitting elements 41 and 42 may be connected in series.

Light-Reflective Member 50

The light-reflective member 50 reflects light emitted from the light emitting elements 41 and 42 toward the opening 11a. The light-reflective member 50 is disposed in a region surrounded by (i.e., disposed between) the inner lateral wall surfaces 31c, 31d, 31e and 31f of the recess 11 and the second resin portion 32. More specifically, the light-reflective member 50 covers the inner lateral wall surfaces 31c, 31d, 31e and 31f, a part of the upper surface 21a that is at an outer side of the second resin portion 32, the upper surface 22a of the second leas 22, and a part of the third resin portion 33. The light-reflective member 50 is not disposed at an inner side of the second resin portion 32, that is, on the element mounting region 21r.

The light-reflective member 50 has the inclined surface 50s between the inner lateral wall surfaces 31c, 31d, 31e and 31f and the second resin portion 32. The inclined surface 50s is recessed toward the bottom 11b of the recess 11. The light-reflective member 50 having the inclined surface 50s of such a shape reflects the light emitted from the light emitting elements 41 and 42 toward the opening 11a, and thus allows for improving the light output efficiency of the light emitting device 101.

An angle defined by a straight line connecting a top end and a bottom end of the inclining surface 50s of the light-reflective member 50, and the bottom 11b of the recess 11, maybe smaller than an angle defined by a straight line connecting a top end and a bottom end of each of the inner lateral wall surfaces 31c, 32d, 32e and 32f of the resin package 10, and the bottom 11b of the recess 11. This is because the light-reflective member 50 may be formed to the vicinity of the light emitting elements 41 and 42. The light-reflective member 50 with such a structure allows light emitted from the light emitting elements 41 and 42 to be reflected toward the opening 11a efficiently.

The light-reflective member 50 is preferably made of a material that does not easily transmit or absorb light from the light emitting elements 41 and 42 or an external light. It is preferable that the light-reflective member 50 is white. For example, a resin for a base material of the light-reflective member 50 maybe a thermosetting resin, a thermoplastic resin or the like.

More specifically, a phenol resin, an epoxy resin, a BT resin, PPA, a silicone resin, or the like may be used for a base material of the light-reflective member 50. In such a resin to be the base material, light scattering particles of a light-reflective material that does not easily absorb the light from the light emitting elements 41 and 42 and has a refractive index greatly different from that of the base material (e.g., titanium oxide, zinc oxide, silicon oxide, zirconium oxide, aluminum oxide, aluminum nitride, etc.) may be dispersed, which allows for reflecting light efficiently. It is preferable that the material of the light-reflective member 50 in an uncured state has a viscosity lower than that of the material of the resin body 30 in an uncured state. For example, the viscosity of the material of the light-reflective member 50 in an uncured state is preferably in a range of 1 pa·s to 20 pa·s, and more preferably 5 pa·s to 15 pa·s. With such a viscosity, a material of the light-reflective member 50 wet-spreads sufficiently in the recess 11, and the light-reflective member 50 can be inhibited from being insufficiently filled. In general, if a resin contains a great amount of filler particles such as light scattering particles or the like, the entire viscosity of the resin is increased. However, in the light emitting device 101 according to the present disclosure, at least one of the inner lateral wall surface 31c, 32d, 31e or 31f includes the protruding portion 31g. Therefore, even if the light-reflective member 50 has a high viscosity, insufficient filling with the light-reflective member 50 canbe inhibited. It is preferable that the light-reflective member 50 in an uncured state has a high thixotropy.

It is preferable that the light-reflective member 50 has a light reflectance higher than that of the resin body 30. For example, the amount of the light-reflective substance (e.g., titanium oxide) contained in the light-reflective member 50 is larger than the amount of the light-reflective substance contained in the resin body 30. Specifically, the amount of the light-reflective substance contained in the light-reflective member 50 is preferably at least 1.5 times, more preferably at least twice, and still more preferably at least 2.5 times as great as the amount of the light-reflective substance contained in the resin body 30. For example, in the light-reflective member 50, titanium oxide is contained at 40% by weight with respect to the total amount of the uncured resin material.

In the resin body 30, titanium oxide is contained at 15 to 20% by weight with respect to the total amount of the uncured resin material.

Protective Element 60

The light emitting device 101 may include a protective element 60 in order to improve electrostatic withstand voltage. For the protective element 60, any appropriate protective element mountable on a general light emitting device can be used. For example, a Zener diode may be used for the protective element 60. In the light emitting device 101, the protective element 60 and the light emitting elements 41 and 42 are connected in parallel.

As shown in FIG. 2B, the protective element 60 may be disposed on the upper surface 22a of the second lead 22. The protective element 60 is buried in the light-reflective member 50. Thus, absorption of the light from the light emitting elements 41 and 42 into the protective element 60 can be reduced.

Of two terminals of the protective element 60, one is electrically connected with the upper surface 22a of the second lead 22 by a joining member. Examples of the joining member include a solder such as a tin-bismuth based solder, a tin-copper based solder, a tin-silver based solder, or a gold-tin base solder; a conductive paste or bump made of silver, gold, palladium or the like; or a brazing material such as an anisotropic conductive material and a low melting point metal material. The other terminal of the protective element 60 is connected with the upper surface 21a of the first lead 21 by a wire 61.

Sealing Member

The light emitting device 101 may include a sealing member. The sealing member is disposed in a recess 51, which is defined by the inclined surface 50s of the light-reflective member 50, located in the recess portion 11. The sealing member covers the light emitting elements 41 and 42 at an inner side of the second resin portion 32, which is disposed at a bottom of the recess 51. The sealing member protects the light emitting elements 41 and 42 against an external force, dust, moisture or the like.

The sealing member is formed of a material transmitting preferably 60% or more, more preferably 90% or more, of the light emitted from the light emitting elements 41 and 42. For the sealing member, a resin material usable for the resin body 30 can be used.

For a base material of the sealing member, a thermosetting resin, a thermoplastic resin or the like may be used. Examples of the base material include, a silicone resin, an epoxy resin, an acrylic resin, and a resin containing one or more of these. The sealing member may be made of a single layer or may include a plurality of layers. In the sealing member, light scattering particles such as titanium oxide, silicon oxide, zirconium oxide, or aluminum oxide may be dispersed.

The sealing member may contain a material for converting the wavelength of light emitted from the light emitting elements 41 and 42 (e.g., a fluorescent material). More specifically, for the fluorescent material, yttrium aluminum garnet activated by cerium, lutetium aluminum garnet activated by cerium, nitrogen-containing calcium aluminosilicate activated by europium and/or chromium (where a part of calcium may be substituted with strontium), sialon activated by europium, silicate activated by europium, strontium aluminate activated by europium, potassium fluorosilicate activated by manganese, or the like can be used.

The amount of the light scattering particles and/or the fluorescent material may be preferably, for example, about 10 to 100% by weight with respect to the total weight of the sealing member.

Method of Producing the Light Emitting Device 101

An embodiment of the method of producing the light emitting device 101 according to the present disclosure will be described. The method of producing the light emitting device 101 according to the present disclosure includes: (A) preparing a collective substrate 201 and (B) singulating the collective substrate 201 to obtain a plurality of the light emitting devices 101. Hereinafter, each step will be described in detail.

(A) Providing the Substrate Assembly 201

Figure 4A:
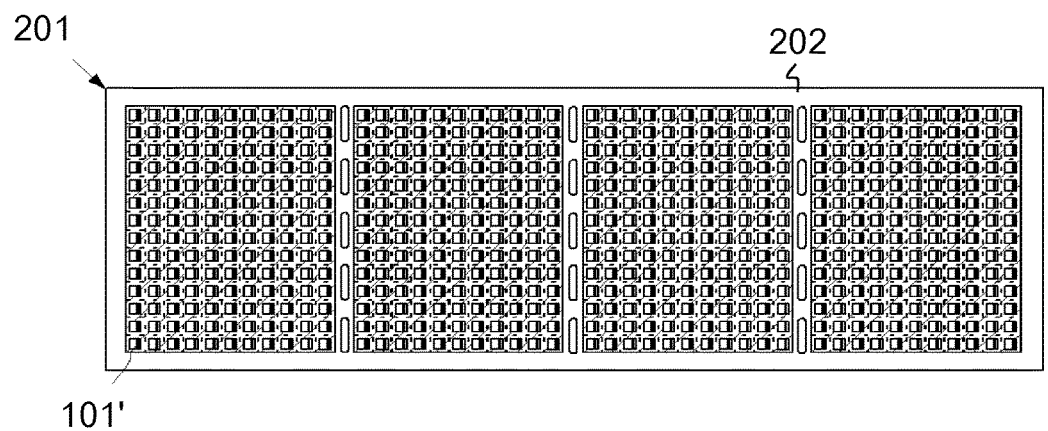
FIG. 4A is a schematic top view of a collective substrate 201.

FIG. 4A is a schematic top view of the collective substrate 201. The collective substrate 201 includes a plurality of portions each of which is to be the light emitting device 101 (hereinafter, such a portion will be referred to as a "light emitting device region 101'").

Figure 4B:
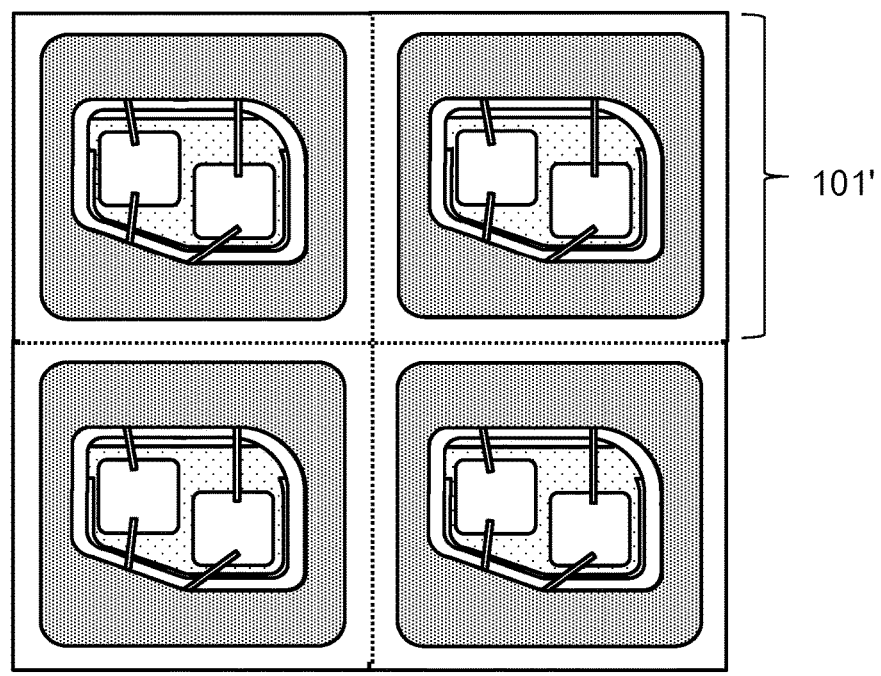
FIG. 4B is a schematic top view of four light emitting device regions 101'.

The light emitting device regions 101' are arranged two-dimensionally. FIG. 4B is a schematic top view of four light emitting device regions 101'. The light emitting device regions 101' each have the same structure as that of the light emitting device 101 described above with reference to FIG. 1A through FIG. 3B, except that the light emitting device region 101' is has not been singulated yet.

Figure 5:
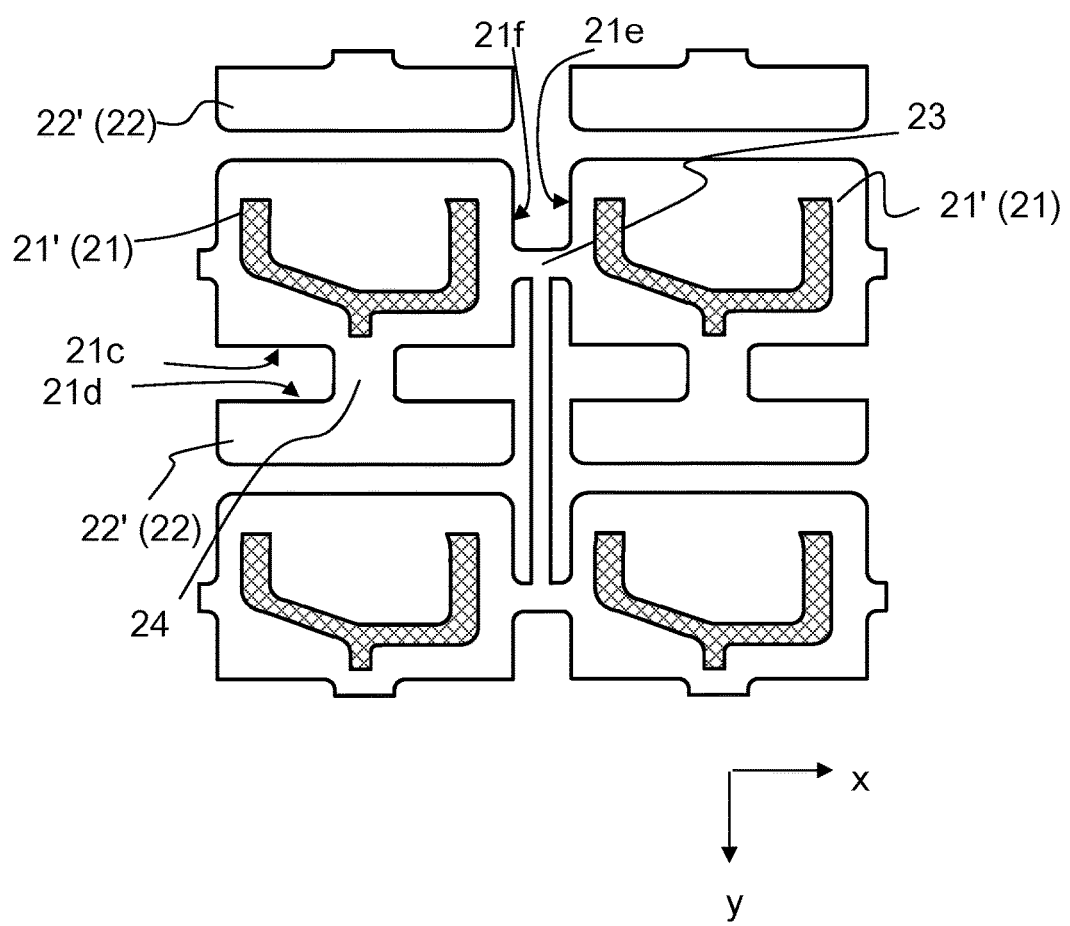
FIG. 5 is a schematic top view of a portion of a lead frame that corresponds to the four light emitting device regions 101'.

First, the resin body 30 is formed on a lead frame 202, which includes a plurality of portions to be the first leads 21 (hereinafter, referred to as "first lead regions 21'") and a plurality of portions to be the second leads 22 (hereinafter, referred to as "second lead regions 22'"). FIG. 5 shows, of the lead frame 202 including the plurality of first lead regions 21' and the plurality of second lead regions 22', a portion that corresponds to four light emitting device regions 101'. In the lead frame 202, the first lead regions 21' and the second lead regions 22' are arranged alternately in a y direction. In an x direction, a plurality of the first lead regions 21' or a plurality of the second lead regions 22' are arranged side by side.

In the y direction, the lateral portion 21c of one first lead region 21' and the lateral portion 22d of one second lead region 22' are connected with each other by a coupling portion 24. In the x direction, the lateral portion 21f of one of the first lead regions 21' and the lateral portion 21e of an adjacent one of first lead region 21' are connected with each other via a connecting portion 23.

The resin body 30 may be formed to hold the lead frame 20 by using, for example, a transfer molding method, an injection molding method, a compression molding method or the like.

Figure 6A:
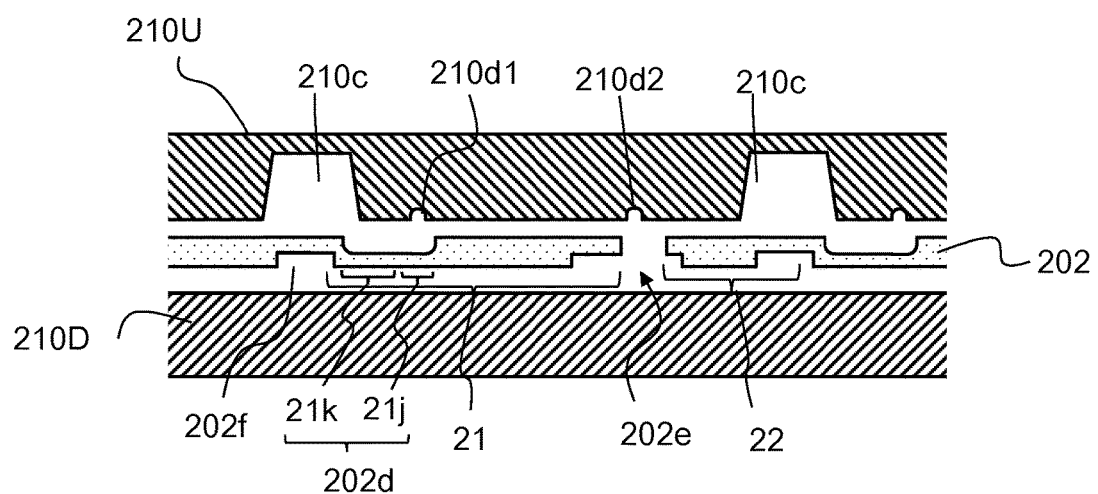
FIG. 6A is a cross-sectional view illustrating a step in a method of producing the light emitting device.

As shown in FIG. 6A, the lead frame 202 is held by molds including an upper mold 210U and a lower mold 210D. The upper mold 210U defines a first space 210c, in which the first resin portion 31 is to be formed, and a second space 210d1 and 210d2, in which the first portion 32c of the second resin portion 32 is to be formed. The second space 210d1 and the second space 210d2 are shown to be separated from each other in FIG. 6A, but the second space 210d1 and the second space 210d2 are cross-sections of a single ring-shaped space.

In the upper mold 210U, the second spaces 210d1 and 210d2 are not connected with, and are independent from the first space 210c. In this embodiment, the bottom mold 210D does not define any space.

The lead frame 202 defines a third space 202e, a fourth space 202d in an upper surface thereof, and a fifth space 202f in a lower surface thereof. The third space 202e has a shape that corresponds to the shape of the third resin portion 33. In the third space 202e, the third resin portion 33 is to be formed. The fourth space 202d of the lead frame 202 includes the first groove 21j and the second groove 21k in the first lead 21.

In the fourth space 202d, the second portion 32d of the second resin portion 32 and the resin connection portion 34 are to be formed. In the fifth space 202f, a part of the first resin portion 31 is to be formed.

As described above, in the upper mold 210U, the first space 210c is separated from the second space 210d1 and 210d2. In a state where the lead frame 202 is disposed between the upper mold 210U and the lower mold 210D, the first space 210c is connected with the second groove 21k of the fourth space 202d of the lead frame 202. Further, the second space 210d1 of the upper mold 210U is connected with the first groove 21j of the fourth space 202d of the lead frame 202. Even further, the second space 210d2 of the upper mold 210U is connected with the third space 202e of the lead frame 202.

Figure 6B:
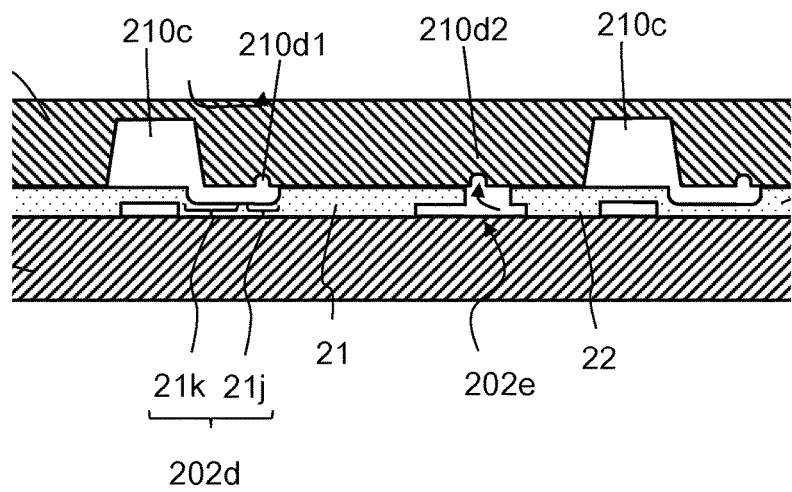
FIG. 6B is a cross-sectional view illustrating a step in the method of producing the light emitting device.

As shown in FIG. 6B, a resin material which is to be formed into the resin body 30 is injected in an uncured state into the above-described spaces in the upper mold 210U and the lower mold 210D of the molds. The above-described spaces in the upper mold 210U and the above-described spaces in the lead frame 202 are connected with each other. Therefore, the spaces are filled with the uncured resin material. In particular, the uncured resin material filling the first space 210c spreads to the second space 202d1 via the fourth space 204d (i.e., the second groove 21k and the first groove 21j) as indicated by the arrow in FIG. 6B. The uncured resin material filling the third space 202e extends to the second space 202d2 as indicated by the arrow in FIG. 6B. Although not shown FIGS. 6A and 6B, the first space 210c is also connected with the fifth space 202f. Therefore, for example, all the spaces are filled with the uncured resin material.

As described above, according to the light emitting device 101 and the method of producing the light emitting device 101 of the present disclosure, at the time of forming the resin body 30, the second groove 21k in the first lead 21, in which the resin connection portion 34 of the resin body 30 is to be formed, serves as a passage to the second space 210d1 and 210d2 of the molds, in which the second resin portion 32 is to be formed.

With such an arrangement, at the time of forming the resin package 10 by molding with use of the molds, the second resin portion 32 is formed at the same time.

In the molds, the second space 210d1, 210d2 is connected with the other spaces at two positions thereof. More specifically, the second space 210d1 is connected with the first space 210c, in which the first resin portion 31 is to be formed, via the fourth space 202d, and the second space 210d2 is connected with the third space 202e. The uncured resin material is supplied to the second spaces 210d1 and 210d2 in the mold from the above-mentioned two positions. Therefore, the possibility that the second spaces 210d1 and 210d2 in the molds are not sufficiently filled with the resin material is decreased.

As shown in FIG. 2B, the second groove 21k serving as the passage is connected with the first groove 21j at substantially the middle position between two ends of the first groove 21j. Therefore, in the first groove 21r and the second spaces 210d1 and 210d2, the uncured resin material is separated to be spread in two different directions, at the position where the second groove 21k is connected with the first groove 21j. Thus, the spaces can be filled with the uncured resin material uniformly in a short time.

Then, the resin material 211 in the molds is heated at a predetermined temperature to perform pre-curing.

Figure 6C:
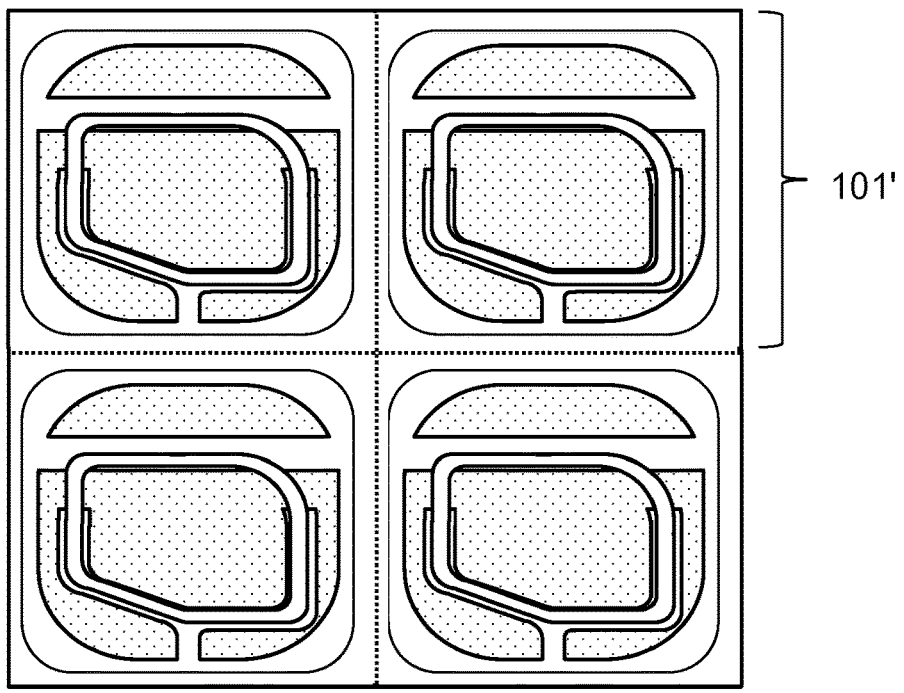
FIG. 6C is a schematic top view of four resin packages.

After this, the resin material 211 subjected to the pre-curing is taken out from the molds, and is heated at a temperature higher than the temperature at which the pre-curing of the resin material 211 is performed to perform curing of resin material 211. Accordingly, the collective substrate 201 including the lead frame 202 and the resin body 30 molded with the lead frame 202 (resin molded body-attached lead frame) is produced. FIG. 6C is a schematic top view of four light emitting device regions 101' that have not been singulated.

The collective substrate 201 may be provided by manufacturing through the above-described method.

Alternatively, the collective substrate 201 may be provided by, for example, purchasing a collective substrate that have been manufactured. A plurality of the resin packages 10 may be integrally molded, or individually molded. The present invention is not limited to the case of using a collective substrate 201 including the plurality of resin packages 10, For example, and for example, a single resin package 10 may be provided and used.

Figure 7:
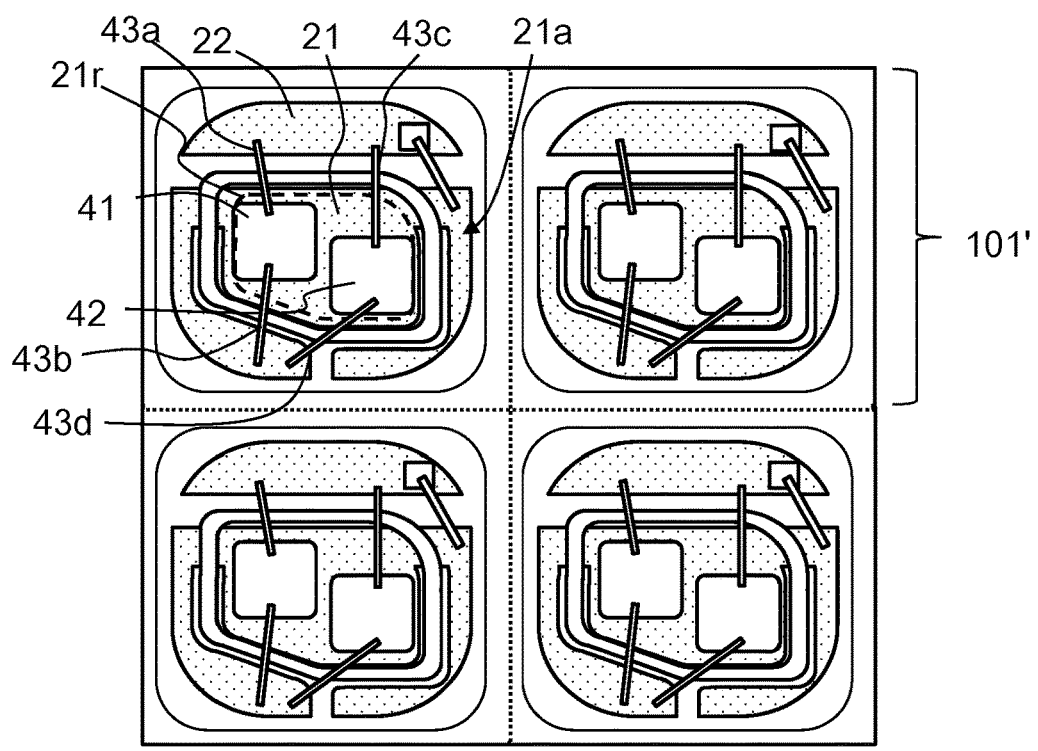
FIG. 7 is a schematic plan view showing a state where light emitting elements are mounted on the four resin packages.

The light emitting elements 41 and 42 are disposed on the bottom 11b of the recess 11 in each light emitting device region 101'. In the present embodiment, the light emitting elements 41 and 42 are bonded onto the first lead region 101' by a joining member made of, for example, a resin material described above. Further, as shown in FIG. 7, the wires 43a, 43b, 43c and 43d for electrically connecting the light emitting elements 41 and 42 with the first lead region 21' and the second lead region 22' are formed. In the case where the light emitting device 101 includes the protective element 60, the protective element 60 is located in the recess 11 at this time.

The light-reflective member 50 is formed in the recess 11 of the light emitting device region 101'. More specifically, a resin material for the light-reflective member 50 in an uncured state is disposed on the bottom 11b of the recess 11 of the light emitting device region 101'. The light-reflective member 50 may be formed by using a potting technique. A potting technique is a method of applying (i.e., depositing) a resin material once to spread the resin material is into an appropriate region by natural flowing of the resin material. In the light emitting device 101 and with the method of producing the light emitting device 101 according to the present disclosure, the second resin portion 32 is disposed surrounding the element mounting region 21r.

With this arrangement, even in the case where the uncured resin material is spread by natural flowing, the inner periphery of the region where the uncured resin material is spread is demarcated by the second resin portion 32. The second resin portion 32 is connected with the first resin portion 31 of the resin package 10 via the third resin portion 33 and the resin connection portion 34.

With this arrangement, the second resin portion 32, although being located on the upper surface 21a of the first lead 21, can be inhibited from being detached from the upper surface 21a of the first lead 21. The upper surface 33a of the third resin portion 33 and the upper surface 34a of the resin connection portion 34 are located at the same height as that of the upper surface 21a of the first lead 21.

Therefore, neither the third resin portion 33 nor the resin connection portion 34 inhibits the natural flowing of the uncured resin material.

After being deposited in a manner as described above, the uncured resin material for the light-reflective member 50 is cured by applying heat, light or the like. As a result, as shown in FIG. 4A, the collective substrate 201 including a plurality of the light emitting device region 101' in a state of not being singulated is produced.

(B) Singulating the Collective Substrate 201 to Provide a Plurality of the Light Emitting Devices 101

The collective substrate 201 is singulated to provide a plurality of the light emitting devices 101.

Examples of a method of singulating the collective substrate 201 includes various methods such as using a lead-cutting mold, cutting with a dicing saw, and cutting with laser light. At the time of singulating the collective substrate 201, in the case where, for example, a plurality of resin packages are integrally molded, the first and second leads and the resin body are cut at the same time to singulate. In the case where the resin packages are individually molded, the collective substrate 201 can be singulated by cutting only the first and second leads.

Figure 8A:
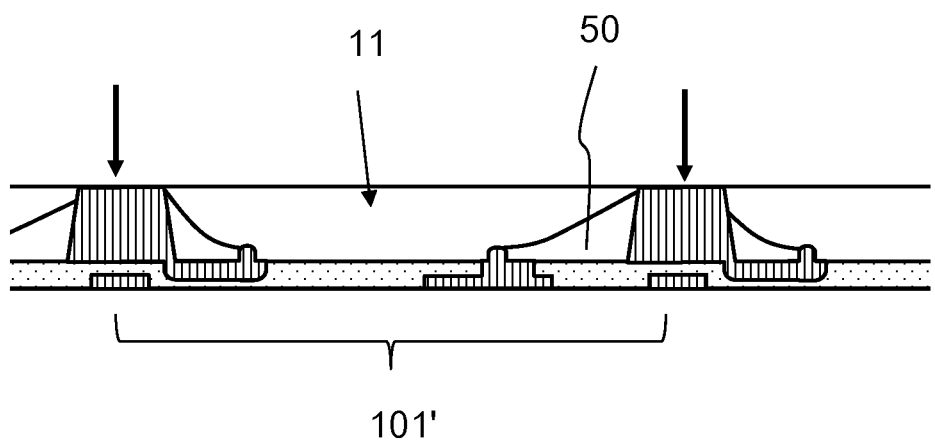
FIG. 8A is a cross-sectional view showing a step in a method of producing the emitting device.
Figure 8B:
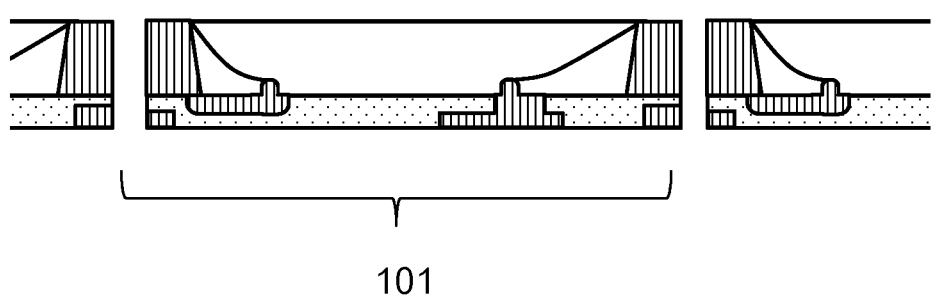
FIG. 8B is a cross-sectional view showing a step in the method of producing the light emitting device.

As shown in FIG. 8A, the collective substrate 201, which includes a plurality of the light emitting device regions 101' each including the light-reflective member 50 in the recess 11, is cut at predetermined positions indicated by arrows. As a result, as shown in FIG. 8B, the plurality of light emitting devices 101 are provided.

Effects

In the light emitting device 101, the resin connection portion 34 is connected with the first resin portion 31. This can inhibit the second resin portion 32 from being detached from the bottom 11b of the recess 11. Therefore, with the second resin portion 32 that demarcates the inner periphery of the light-reflective member 50, and with the light-reflective member 50 disposed between the inner lateral wall surfaces 31c, 31d, 31e and 31f and the second resin portion 32 as described above, the light emitting device 101 can have a high light extraction efficiency.

Further, with the resin connection portion 34 and the second portion 32d of the second resin portion 32 that are disposed in the second groove 21k and the first groove 21j, respectively, that are formed in the upper surface 21a of the first lead 21, the contact area between the first lead 21 and the resin connection portion 34 and the contact area between the first lead 21 and the second portion 32d of the second resin portion 32 can be increased, and thus adhesiveness can be improved.

The second resin portion 32 is connected with at least a portion of the resin connection portion 34 and a portion of the third resin portion 33. With such an arrangement, at the time of injecting the uncured resin material in a molding method, the spaces in which the resin connection portion 34 and the third resin portion 33 are to be formed serve as passages to the space in which the second resin portion 32 is to be formed. Therefore, the space in which the second resin portion 32 is to be formed can be inhibited from being insufficiently filled with the uncured resin material.

Other Embodiments

The light emitting device 101 may be modified in various forms. For example, in this embodiment, the light emitting device 101 includes one resin connection portion 34, but may alternatively include a plurality of the resin connection portions 34. The plurality of the resin connection portions 34 may be disposed to be in contact with one or more of the inner lateral wall 31c, 31e or 31f of the first resin portion 31.

While exemplary embodiments of the present invention have been described above, it will be apparent to those skilled in the art that the disclosed invention may be modified in numerous ways and may assume many embodiments other than those specifically described above. Accordingly, it is intended by the appended claims to cover all modifications of the invention that fall within the true spirit and scope of the invention.

What is claimed is:

1. A light emitting device comprising:
   a resin package comprising:
      a plurality of leads that includes:
         a first lead having an upper surface, and
         a second lead having an upper surface, and
      a resin body that includes:
         a first resin portion having at least one inner lateral wall surface,
         a second resin portion, a third resin portion disposed between the first lead
and the second lead and having an upper surface,
and
a resin connection portion,
the plurality of leads and the at least one inner lateral
wall surface of the first resin portion defining a
recess,
the upper surface of the first lead, the upper surface of
the second lead and the upper surface of the third
resin portion located at a bottom of the recess,
at the bottom of the recess, the second resin portion
being in contact with a portion of the upper surface
of the third resin portion and surrounding an element
mounting region, and
the resin connection portion connecting the first resin
portion and the second resin portion at the bottom of
the recess;
at least one light emitting element disposed on the element mounting region at the bottom of the recess of the
resin package; and
a light-reflective member disposed between the inner
lateral wall surface and the second resin portion in the
recess.

2. The light emitting device according to claim 1, wherein:
the first lead has:
a first groove in the upper surface thereof, the first
groove disposed along at least a portion of an outer
perimeter of the element mounting region, and
a second groove connected with the first groove; and
at least a part of the second resin portion is located in the
first groove, and the resin connection portion is disposed in the second groove.

3. The light emitting device according to claim 1, wherein:
the first resin portion, the second resin portion and the
third resin portion are made of the same material.

4. A method of producing a plurality of light emitting devices, the method comprising:
providing a collective substrate including a plurality of
light emitting device regions, each of the light emitting
device regions comprising:
a resin package comprising:
a plurality of leads that includes a first lead and a
second lead, and
a resin body that includes:
a first resin portion having an upper surface and at
least one inner lateral wall,
a second resin portion having an upper surface,
a third resin portion disposed between the first
lead and the second lead and having an upper
surface, and
a resin connection portion,
the plurality of leads and the at least one inner lateral
wall of the first resin portion defining a recess,
the upper surface of the first lead, the upper surface
of the second lead, and the upper surface of the
third resin portion located at a bottom of the recess
at the bottom of the recess, the second resin portion
being in contact with a portion of the upper
surface of the third resin portion and surrounding
an element mounting region, and
the resin connection portion connecting the first resin
portion and the second resin portion at the bottom
of the recess,
at least one light emitting element disposed on the
element mounting region at the bottom of the recess
of the resin package, and
a light-reflective member disposed between the inner
lateral wall surface and the second resin portion in
the recess; and
singulating the collective substrate to obtain a plurality of
the light emitting devices.

5. The method of producing a light emitting device according to claim 4, wherein:
the collective substrate includes a lead frame including a
plurality of the first leads and a plurality of the second
leads;
each of the plurality of first leads includes:
a first groove in the upper surface thereof, the first
groove disposed along at least a portion of an outer
perimeter of the element mounting region, and
a second groove connected with the first groove; and
the step of providing the collective substrate comprising:
disposing the lead frame between a lower mold and an
upper mold, the upper mold having a first space in
which the first resin portion is to be formed and a
second space in which a portion of the second resin
portion is to be formed such that the first space is
connected with the second groove and the second
space is connected with the first groove; and
filling the first space, the second space, the first groove
and the second groove with an uncured resin material
and curing the uncured resin material such that the
resin connection portion is disposed in the second
groove and said portion of the second resin portion
is located in the first groove.

* * * * *